US010297300B2

(12) United States Patent
Schafer et al.

(10) Patent No.: US 10,297,300 B2
(45) Date of Patent: May 21, 2019

(54) METHOD AND SYSTEM FOR DETERMINING TEMPERATURE USING A MAGNETIC JUNCTION

(71) Applicant: Samsung Electronics Co., LTD., Gyeonggi-do (KR)

(72) Inventors: Sebastian Schafer, San Jose, CA (US); Dmytro Apalkov, San Jose, CA (US); Alexey Vasilyevitch Khvalkovskiy, Sunnyvale, CA (US); Vladimir Nikitin, Campbell, CA (US); Robert Beach, San Jose, CA (US); Zheng Duan, Sunnyvale, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 478 days.

(21) Appl. No.: 14/854,251

(22) Filed: Sep. 15, 2015

(65) Prior Publication Data
US 2016/0104544 A1    Apr. 14, 2016

Related U.S. Application Data

(60) Provisional application No. 62/053,191, filed on Sep. 21, 2014.

(51) Int. Cl.
*G11C 29/00* (2006.01)
*G01K 13/00* (2006.01)
(Continued)

(52) U.S. Cl.
CPC .............. *G11C 11/161* (2013.01); *G01K 7/36* (2013.01); *G01R 33/098* (2013.01); *G01R 33/14* (2013.01);
(Continued)

(58) Field of Classification Search
CPC ... G11C 29/00; G11C 11/161; G11C 11/5607; G11C 11/02; G11C 2211/5615;
(Continued)

(56) References Cited

U.S. PATENT DOCUMENTS

| 7,510,883 B2 * | 3/2009 | Chung | ..................... G01K 7/36 |
| | | | 257/414 |
| 8,456,893 B2 * | 6/2013 | Horng | ..................... H01L 43/12 |
| | | | 365/148 |

(Continued)

FOREIGN PATENT DOCUMENTS

KR    20140071260 A  *  6/2014  ........... G11C 11/161

OTHER PUBLICATIONS

Wang, et al. "Time-resolved measurement of spin-transfer-driven ferromagnetic resonance and spin torque in magnetic tunnel junction," published Jun. 30, 2011.
(Continued)

*Primary Examiner* — Gail Kaplan Verbitsky
(74) *Attorney, Agent, or Firm* — Van Pelt, Yi & James LLP

(57) ABSTRACT

A method for measuring a temperature of magnetic junction switchable using spin transfer. The magnetic junction includes at least one magnetic layer. The method includes measuring a temperature variation of at least one magnetic characteristic for the magnetic layer(s) versus temperature. The method also includes measuring a bias variation in the magnetic characteristic versus an electrical bias for the magnetic junction. This measurement is performed such that spin transfer torque-induced variation(s) in the magnetic characteristic(s) are accounted for. The temperature versus the electrical bias for the magnetic junction is determined based on the temperature variation and the bias variation.

9 Claims, 9 Drawing Sheets

(51) Int. Cl.
*G11C 11/16* (2006.01)
*G01R 33/14* (2006.01)
*G11C 7/04* (2006.01)
*G11C 29/50* (2006.01)
*G01R 33/09* (2006.01)
*G01K 7/36* (2006.01)

(52) U.S. Cl.
CPC ............ *G11C 7/04* (2013.01); *G11C 11/16* (2013.01); *G11C 11/1695* (2013.01); *G11C 29/50* (2013.01); *G11C 2029/5002* (2013.01)

(58) Field of Classification Search
CPC .......... G01K 13/00; G01K 7/36; G01R 33/14; G01R 33/093; G01R 33/098; G01R 33/1284; H01L 27/222; H01F 10/3286; H01F 10/3295; H01F 10/329; G11B 5/3909; Y10S 977/935
USPC .......................... 324/200; 374/141, 163, 176
See application file for complete search history.

(56) References Cited

U.S. PATENT DOCUMENTS

| | | | |
|---|---|---|---|
| 8,594,967 B2 | 11/2013 | Lee | |
| 8,604,572 B2* | 12/2013 | Wang | B82Y 25/00 257/421 |
| 8,698,259 B2* | 4/2014 | Krounbi | H01L 43/08 257/421 |
| 8,767,453 B2 | 7/2014 | Dieny | |
| 9,058,885 B2 | 6/2015 | Luo | |
| 9,342,294 B2 | 5/2016 | Naccache | |
| 9,384,811 B2* | 7/2016 | Apalkov | H01L 43/08 |
| 9,576,633 B2* | 2/2017 | Schafer | G11C 11/161 |
| 9,792,971 B2 | 10/2017 | Carey | |
| 2010/0065935 A1* | 3/2010 | Horng | B82Y 25/00 257/421 |
| 2011/0303997 A1* | 12/2011 | Wang | B82Y 25/00 257/421 |
| 2012/0181651 A1 | 7/2012 | Jiang | |
| 2012/0290773 A1* | 11/2012 | Naccache | G06F 8/66 711/103 |
| 2012/0307556 A1 | 12/2012 | Dieny | |
| 2013/0015542 A1 | 1/2013 | Wang | |
| 2013/0154035 A1 | 6/2013 | Krounbi | |
| 2013/0322162 A1 | 12/2013 | Lee | |
| 2015/0270479 A1 | 9/2015 | Prejbeanu | |
| 2017/0069833 A1* | 3/2017 | Kitagawa | H01L 27/222 |
| 2017/0236570 A1 | 8/2017 | Kent | |
| 2017/0309813 A1* | 10/2017 | Naik | H01L 43/10 |
| 2018/0090674 A1 | 3/2018 | Wang | |
| 2018/0309049 A1* | 10/2018 | Chepulskyy | H01L 43/10 |

OTHER PUBLICATIONS

Miwa, S., "Spin-torque magnetic resonance of fe nanoparticles in fe/mgo/fe magnetic tunnel junctions," published Jul. 31, 2013.

Bauer, G., "Spin caloritronics," J. Nature Materials; 11.5 (May 2012): 391-9. ProQuest document ID 1019184691 May 31, 2012.

* cited by examiner

METHOD AND SYSTEM FOR DETERMINING TEMPERATURE USING A MAGNETIC JUNCTION

CROSS-REFERENCE TO RELATED APPLICATIONS

This application claims the benefit of provisional U.S. Patent Application Ser. No. 62/053,191, filed Sep. 21, 2014, entitled ST-FMR MTJ Thermometer, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

FIG. 1 depicts a conventional magnetic tunneling junction (MTJ) 10 as it may be used in a conventional STT-MRAM. The conventional MTJ 10 typically resides on a bottom contact 11, uses conventional seed layer(s) 12 and includes a conventional antiferromagnetic (AFM) layer 14, a conventional pinned layer 16, a conventional tunneling barrier layer 18, a conventional free layer 20, and a conventional capping layer 22. Also shown is top contact 24. Further, other versions of the conventional MTJ 10 might include an additional pinned layer (not shown) separated from the free layer 20 by an additional nonmagnetic barrier or conductive layer (not shown).

The conventional tunneling barrier layer 18 is nonmagnetic and is, for example, a thin insulator such as MgO. Alternatively, a conductive layer maybe used. The conventional pinned layer 16 and the conventional free layer 20 are magnetic. The magnetization 17 of the conventional pinned layer 16 is fixed, or pinned, in a particular direction, typically by an exchange-bias interaction with the AFM layer 14. The conventional free layer 20 has a changeable magnetization 21. Conventional contacts 11 and 24 are used in driving the current in a current-perpendicular-to-plane (CPP) direction, or along the z-axis as shown in FIG. 1.

To switch the magnetization 21 of the conventional free layer 20, a current is driven perpendicular to plane (in the z-direction). When a sufficient current is driven from the top contact 24 to the bottom contact 11, the magnetization 21 of the conventional free layer 20 may switch to be parallel to the magnetization 17 of the conventional pinned layer 16. When a sufficient current is driven from the bottom contact 11 to the top contact 24, the magnetization 21 of the free layer may switch to be antiparallel to that of the pinned layer 16. The differences in magnetic configurations correspond to different magnetoresistances and thus different logical states (e.g. a logical "0" and a logical "1") of the conventional MTJ 10.

Because of their potential for use in a variety of applications, research in magnetic memories is ongoing. For example, mechanisms for improving the performance of STT-MRAM are desired. Accordingly, what is needed is a method and system that may improve the performance of the spin transfer torque based memories. The method and system described herein address such a need.

BRIEF SUMMARY OF THE INVENTION

A method for measuring a temperature of magnetic junction switchable using spin transfer. The magnetic junction includes at least one magnetic layer. The method includes measuring a temperature variation of at least one magnetic characteristic for the magnetic layer(s) versus temperature. The method also includes measuring a bias variation in the magnetic characteristic versus an electrical bias for the magnetic junction. This measurement is performed such that spin transfer torque-induced variation(s) in the magnetic characteristic(s) are accounted for. The temperature versus the electrical bias for the magnetic junction is determined based on the temperature variation and the bias variation.

DETAILED DESCRIPTION OF THE INVENTION

Figure 1:
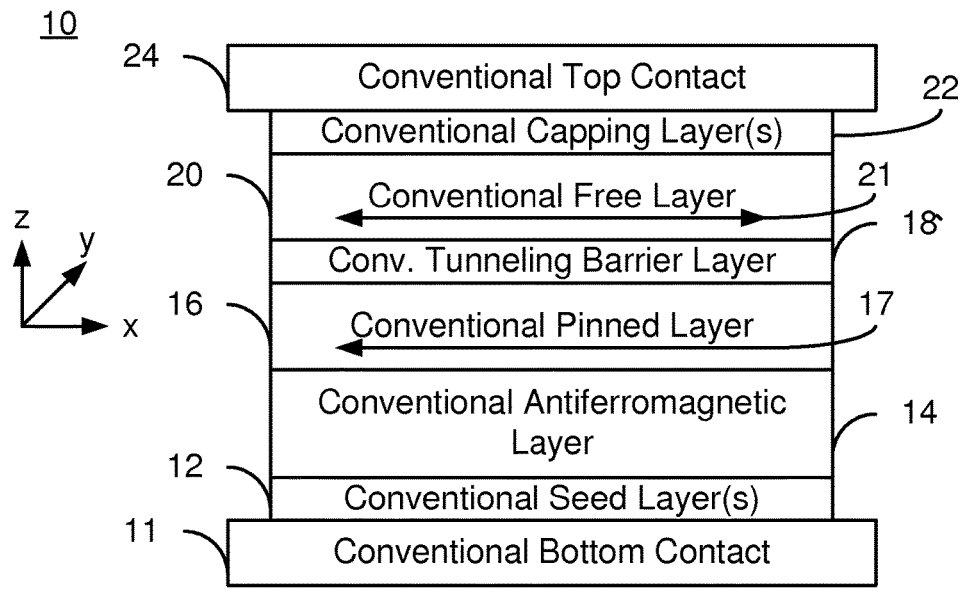
FIG. 1 depicts a conventional magnetic junction.

The exemplary embodiments relate to magnetic junctions usable in electronic devices, such as those using magnetic memories, and other devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The exemplary embodiments include methods for measuring a temperature of magnetic junction that is switchable using spin transfer. The magnetic junction includes at least one magnetic layer. The method includes measuring a temperature variation of at least one magnetic characteristic for the magnetic layer(s) versus temperature. The method also includes measuring a bias variation in the magnetic characteristic versus an electrical bias for the magnetic junction. This measurement is performed such that spin transfer torque-induced variation(s) in the magnetic characteristic(s) are accounted for. The temperature versus the electrical bias for the magnetic junction is determined based on the temperature variation and the bias variation.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and substructures. However, one of ordinary skill in the art will readily recognize that the method and system are consistent with the use of magnetic memories having multiple magnetic junctions and using multiple substructures. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

When used in a magnetic memory or other application, it may be desirable to measure the temperature of a magnetic junction during use. For example, the temperature of the conventional MTJ 10 or other magnetic junction used is desired to be calibrated. During a write operation in a spin transfer torque (STT) magnetic memory, the magnetic junction is subject to joule heating. The current density of the write current driven through the magnetic junction may significantly increase the temperature of the magnetic junction. In some cases, it is estimated that the temperature of the magnetic junction may be greater than two hundred degrees Celsius above the ambient temperature during a write pule. Such temperature may affect the performance, endurance and/or reliability of the magnetic memory or other device in which the magnetic junction is used. Thus, a reliable mechanism for determining temperature of a magnetic junction during use may be desired. More specifically, it may be beneficial to calibrate the temperature of the magnetic junction with the electrical bias that may be applied to generate a spin transfer write or read current.

Figure 2:
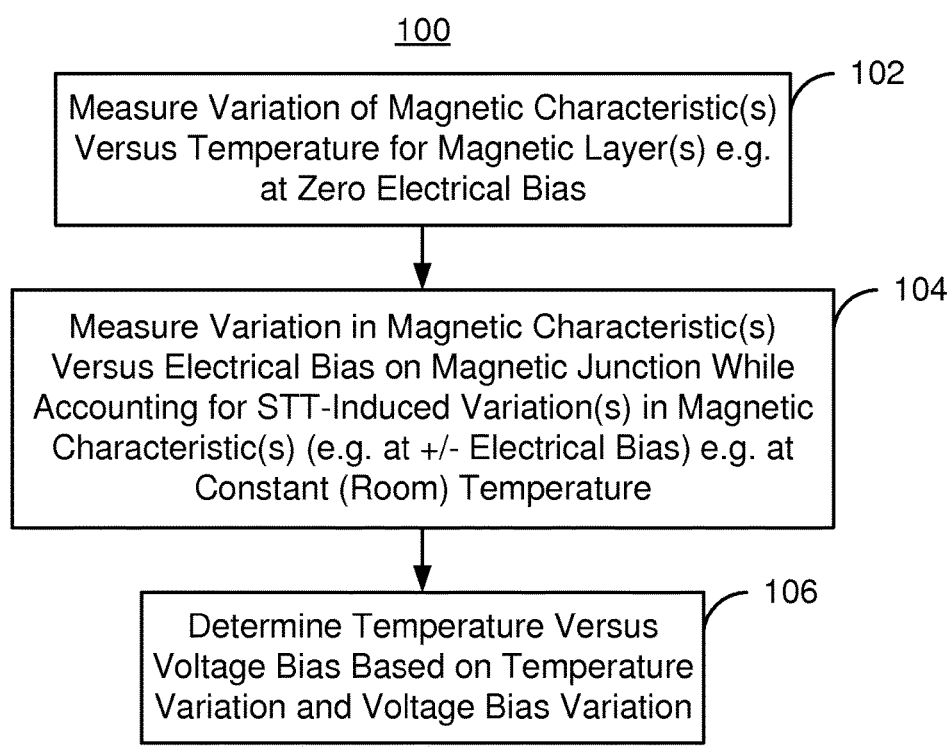
FIG. 2 depicts an exemplary embodiment of a method for determining a temperature of a magnetic junction usable in a magnetic memory programmable using spin transfer torque.

FIG. 2 depicts an exemplary embodiment of a method 100 for determining a temperature of a magnetic junction usable in a magnetic memory programmable using spin transfer torque. For example, the method 100 may be used with the magnetic junction 10 or another magnetic junction. For simplicity, some steps may be omitted or combined. Further, the method 100 may be incorporated into use of magnetic memories. Thus the method 100 may be used in improving performance of magnetic junctions and/or the magnetic memory, such as a STT-MRAM or other magnetic memory that employs the magnetic junctions. The method 100 is utilized to calibrate the temperature of a magnetic junction.

The magnetic junction with which the method 100 is used includes at least one magnetic layer that is used to determine the temperature variation. In some embodiments, the magnetic junction includes at least a reference layer, a nonmagnetic spacer layer such as a crystalline MgO tunneling barrier layer and a free layer. The magnetic junction may also be a dual junction including an additional nonmagnetic layer and an additional free layer. In some cases, the magnetic junction may include other magnetic layers, such as polarization enhancement layer(s) (PEL(s)) between the free layer and the reference layer. The reference layer may be a multilayer. For example, the reference layer may be a synthetic antiferromagnet (SAF) including antiferromagnetically coupled ferromagnetic layers interleaved with and sandwiching nonmagnetic layer(s). The reference layer might also include ferromagnetically coupled ferromagnetic layer interleaved with and sandwiching nonmagnetic layer(s). Other magnetic layers may also be included. Thus, one or more of these layers, or their constituent ferromagnetic layers, may be the magnetic layer(s) which are used to determine the temperature variation of the magnetic junction.

One or more magnetic characteristics of the magnetic layer(s) is used in the method 100 to calibrate the temperature of the magnetic junction. Thus, this characteristic should vary with temperature. The magnetic characteristic should also vary with electrical bias, as described below. The magnetic characteristic that may be used in the method 100 may include a magnetic anisotropy for the magnetic layer. The magnetic anisotropy might have various sources and/or be expressed in various ways. For example, the shift in the center of the hysteresis loop from zero applied magnetic field for the magnetic layer may be indicative of such an anisotropy. The anisotropy may be due to an interlayer magnetic coupling. For example, an exchange coupling with an AFM or other layer, an interfacial or other magnetic coupling with an adjoining layer, a Ruderman-Kittel-Kasuya-Yosida (RKKY) coupling with another magnetic layer through a nonmagnetic spacer layer such as Ru, an anisotropy due to stray fields from another layer, or other magnetic coupling may give rise to an anisotropy/anisotropies in the magnetic behavior of the magnetic layer(s) in the magnetic junction. The magnetic anisotropy might also be an intrinsic anisotropy such as a crystalline anisotropy. The magnetic characteristic might be another temperature varying characteristic including but not limited to the coercivity (zero crossing(s) in a hysteresis loop) and/or saturation magnetic moment. Other or additional magnetic characteristic(s) might be used. Such characteristics are desired to vary both with temperature and electrical bias. For example, in some cases, the magnetic characteristic(s) are desired to vary by approximately ten(s) of Oersteds over a temperature change of approximately one hundred degrees Celsius. However, other variations are possible.

The temperature variation of the magnetic characteristic(s) of the magnetic layer(s) is determined, via step 102. More specifically, the magnetic characteristic is determined at multiple temperatures. Step 102 may include measuring the magnetic moment at multiple fields (i.e. taking hysteresis loops) at multiple temperatures throughout the temperature range of interest. In some embodiments, the center of the hysteresis loop (shift field), the saturation magnetic moment, the coercivity or other feature may be determined from the hysteresis loop. The measurements taken in step 102 are at a constant electrical bias for the magnetic junction. In some embodiments, the electrical bias is zero or very small. For example, the magnetic junction may be electrically biased by not more than one hundred millivolts. In some embodiments, the electrical bias is not less than twenty millivolts. Thus, only a very small (or zero) current may be driven through the magnetic junction in a current perpendicular-to-plane (CPP) direction. At such small currents, spin transfer torque may be negligible for the measurements taken in step 102. Step 102 may also include converting the measurements into a particular format. For example, if the saturation moment is measured at various temperatures in step 102, then the moment may be converted to a magnetic anisotropy for further analysis.

The variation in the magnetic characteristic(s) versus the electrical bias (electrical bias variation) is determined, via step 104. Step 104 is carried out such that spin transfer torque-induced (STT-induced) variations in the magnetic characteristic(s) are accounted for. Step 104 may include measuring the characteristic(s) of the magnetic layer(s) at various electrical biases at a substantially constant temperature. For example, various voltages may be applied across the magnetic junction room temperature and the appropriate magnetic characteristic(s) measured at each voltage.

An electrical bias, such as a voltage, across the magnetic junction may generate a current through the magnetic junction. This current may induce variations in the magnetic properties of the magnetic layer due to spin transfer torque. More specifically, the current due to the electrical bias may become spin polarized and, therefore, disturb the magnetic properties of the magnetic layer(s). This is the principle at work in STT-MRAM, in which the current actually causes the free layer to change magnetic states (e.g. reverse the direction of magnetization). Thus, as mentioned above, step 104 is performed such that the spin transfer torque is accounted for.

In some embodiments, step 104 includes ensuring that the magnetic layer is sufficiently stable that STT-induced variation(s) are small enough to be discounted. The desired stability depends upon how accurate the temperature calibration is desired to be. For example, for a reference layer in which the coercivity is the magnetic characteristic used to determine temperature, it may be ensured that the reference layer is thick enough that the change in the reference layer coercivity is not more than five percent of the coercivity for the magnetic layer(s). In some such embodiments, the change stability may be such that the STT-induced variations are not more than one percent of the magnetic characteristic. The coercivity of such a reference layer may be determined at various electric biases without spin transfer torque effects adversely affecting the determination.

Other mechanisms might be used in step 104 to account for STT-induced variations by biasing the magnetic junction such that the magnetic characteristic of interest is substantially unaffected by STT-induced variations. For example, for a magnetic anisotropy in which a hysteresis loop is used, the shift in the hysteresis loop (i.e. the location of the center of the hysteresis loop) may be determined in a manner that accounts for spin transfer torque. Stated differently, the true center of the hysteresis loop is determined.

In some embodiments, for example, measurements of the magnetic characteristic(s) are performed at multiple electrical biases with each of the measurements being performed at a positive electrical bias having a magnitude and a negative electrical bias having the same magnitude but opposite direction to reduce or eliminate STT-induced variations. For example, step 104 may include obtaining a hysteresis loop with the bias/current in one direction during half of the hysteresis loop (field increasing in one direction) and the bias/current in the opposite direction during the other half of the hysteresis loop (field increasing in the opposite direction). In such a measurement, the center of the hysteresis loop is substantially unaffected by spin transfer torque. The true center of the hysteresis loop may, therefore, be determined. Thus, spin transfer torque is accounted for in step 104.

In another embodiment, measurements used may be such that the STT-induced variation does not affect the value of the parameter of interest. For example, in ferromagnetic resonance (FMR), the frequency of the resonance peak can be used to obtain the magnetic anisotropy. One type of FMR measurement is spin transfer torque FMR (STT-FMR) in which the resonance is induced by a pulse through the magnetic junction. In other words, a spin transfer current excites the resonance. This technique might be used to excite individual magnetic junctions in a magnetic memory. STT-FMR may be performed at various electrical biases (i.e. various currents) in step 104. In STT-FMR, STT-induced variations generally cause a broadening of the resonance peak in the frequency spectrum, rather than a shift in the position of the resonance peak. Thus, the frequency at which the resonance occurs may be substantially unaffected by STT-induced variations. Thus, step 104 may be performed using STT-FMR. However, note that in some embodiments, positive and negative electrical biases may still be used in order ensure the resonance peak is unshifted and/or to otherwise more fully test the magnetic characteristics of the magnetic junction.

Thus, using step 102 the temperature variation (change in the magnetic characteristic versus temperature) is obtained. In step 104 the electrical bias variation (change in the magnetic characteristic versus electrical bias) is obtained. Step 104 includes accounting or STT-induced variations. Steps 102 and 104 may be performed such that STT-induced variations are nonexistent, negligible, or otherwise accounted for. The temperature variation is mapped to the electrical bias variation such that the change in temperature of the magnetic junction versus the electrical bias is obtained, via step 106. The temperature versus the electrical bias for the magnetic junction is determined based on the temperature variation and the electrical bias variation. Thus, the magnetic junction temperature may be calibrated to the magnetic junction electrical bias.

Using the method 100, the change in temperature of the magnetic junction versus applied electrical bias, such as voltage, to the magnetic junction may be characterized. Use of the method 100 may improve performance of the magnetic junction. In particular, the magnetic anisotropy, coercivity or other relevant parameters may be determined for a particular applied electrical bias. Thus, the device characteristics and operating conditions may be selected to enhance performance, reliability, and/or endurance.

Figure 3:
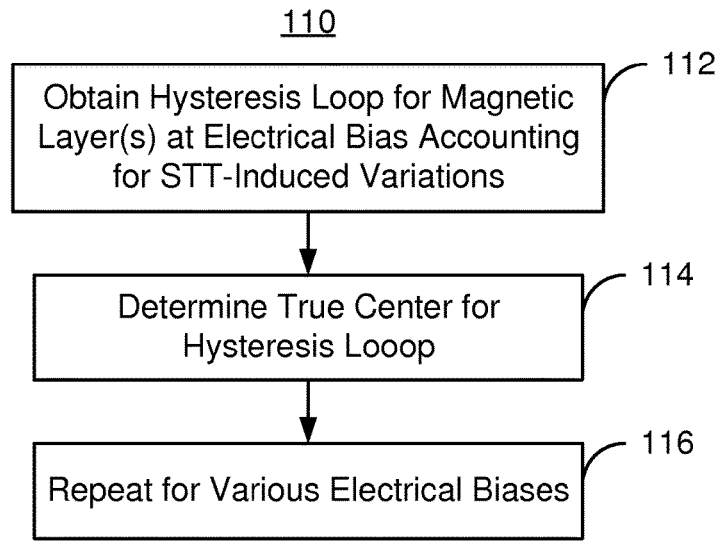
FIG. 3 depicts another exemplary embodiment of a method for determining a temperature of a magnetic junction usable in a magnetic memory programmable using spin transfer torque.
Figure 4:
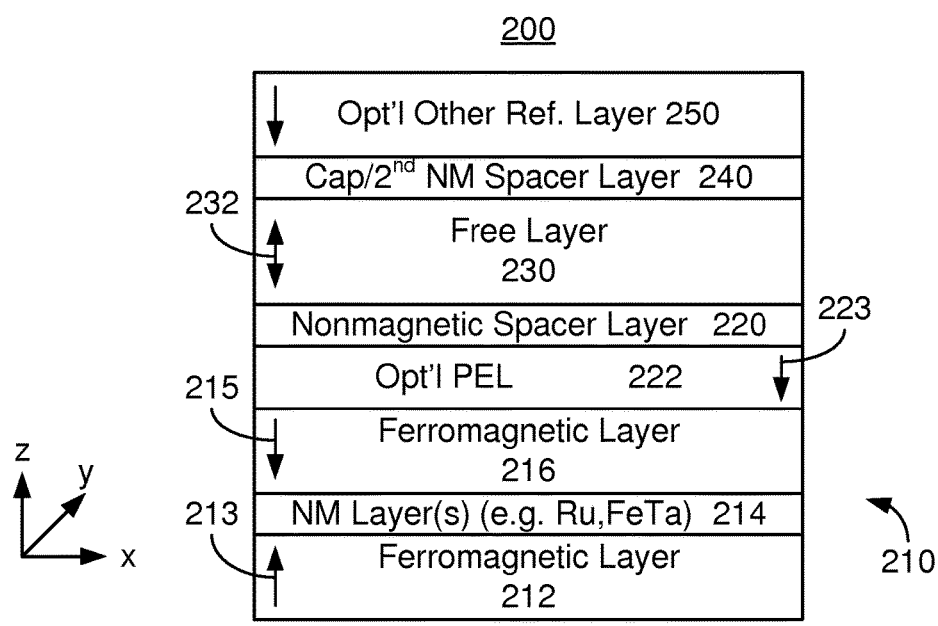
FIG. 4 depicts another exemplary embodiment of a magnetic junction usable in a magnetic memory programmable using spin transfer torque.

FIG. 3 depicts another exemplary embodiment of a method 110 for determining a temperature of a magnetic junction usable in a magnetic memory programmable using spin transfer torque. More specifically, the method 110 may be used for step 104 of the method 100. FIG. 4 depicts an exemplary embodiment of a magnetic junction 200 with which the method 110 may be used. For clarity, FIG. 4 is not to scale. In other embodiments, the method 110 may be used with another magnetic junction having different and/or additional layers. For simplicity, some steps may be omitted or combined. The method 110 may be incorporated into use of magnetic memories. The magnetic junction 200 may be used in a magnetic device such as a STT-MRAM and, therefore, in a variety of electronic devices. The magnetic junction 200 includes a reference layer 210, a nonmagnetic spacer layer 220, a free layer 230 and optional additional nonmagnetic spacer layer 240 and an optional additional reference layer 250, which might be omitted. The layer 240 may be a capping layer if the reference layer 250 is omitted. The magnetic junction 200 may also include optional seed layer(s), optional pinning layer(s), optional capping layer(s) and bottom and top contacts, which are not shown for simplicity. Devices (not shown) including but not limited to a transistor may be formed in the substrate below the magnetic junction 200. Although layers 210, 220, 230, 240 and 250 are shown with a particular orientation, this orientation may vary in other embodiments. For example, the reference layer 210 may be closer to the top (furthest from a substrate) of the magnetic junction 200. The optional pinning layer(s) (not shown) may be used to fix the magnetization of the reference layer(s) 210 and 250, respectively. However, in other embodiments, the optional pinning layers may be omitted or another structure may be used. In some embodiments, the perpendicular magnetic anisotropy energies of the reference layer 210, the free layer 230 and the optional reference layer 250 exceed the out of plane demagnetization energy, the magnetic moments of the layers 210, 230 and 250 may be out of plane (e.g. perpendicular-to-plane). This situation is shown in FIG. 4. In such embodiments, the pinning layer may be omitted. In the embodiment shown, the reference layer 210 is a SAF including ferromagnetic layers 212 and 216 that are separated by a nonmagnetic layer 214. In the embodiment shown, the layers 212 and 216 have magnetic moments 213 and 215, respectively, that are coupled via an RKKY interaction, for example through a Ru layer 214. In other embodiments, the magnetic moments 213 and 215 may be ferromagnetically coupled, for example through an FeTa layer 214. In other embodiments, the reference layer 210 may be a single layer or may be another multilayer including additional or different layers. Similarly, the free layer 230 and/or reference layer 250 may be analogous multilayers. The magnetic junction 200 is also configured to allow the magnetic moment 232 of the free layer 230 to be switched between stable magnetic states when a write current is passed through the magnetic junction 200. Thus, the free layer 230 is switchable utilizing spin transfer torque. Also shown is optional polarization enhancement layer 222 having moment 223, which is magnetically coupled with the layer 210/216. In other embodiments, the PEL 222 may be omitted and/or other PEL(s) (not shown) may be included in other analogous locations.

One or more of the magnetic layers 210, 212, 216, 230, 250 and/or their sublayers (if a multilayer) may be used in carrying out the method 110. For simplicity, the method 110 is explained in the context of the ferromagnetic layer 216 being investigated. However, in other embodiments, another layer might be used.

Figure 5A:
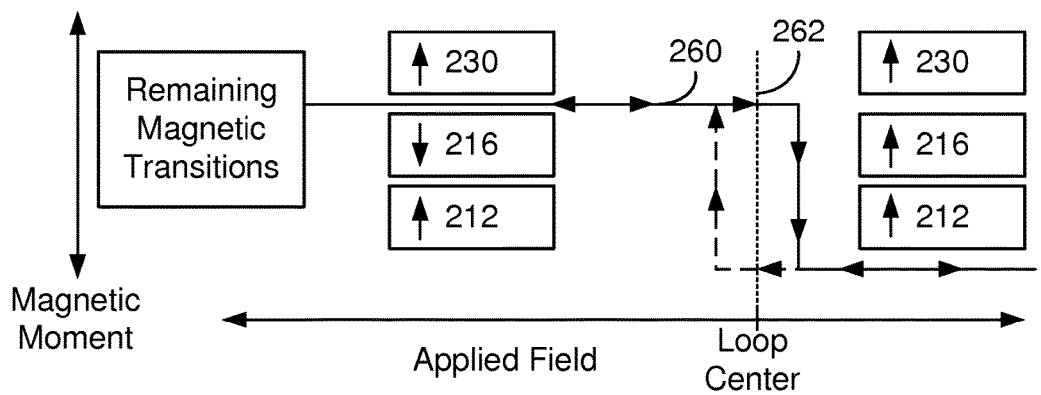
FIGS. 5A-5C depicts an exemplary embodiment of hysteresis loops for a magnetic junction usable in a magnetic memory programmable using spin transfer torque.
Figure 5B:
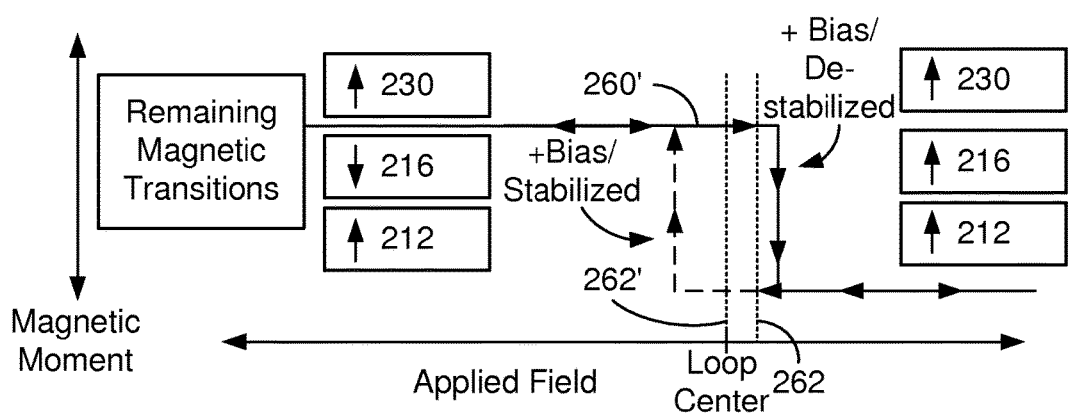
Figure 5C:
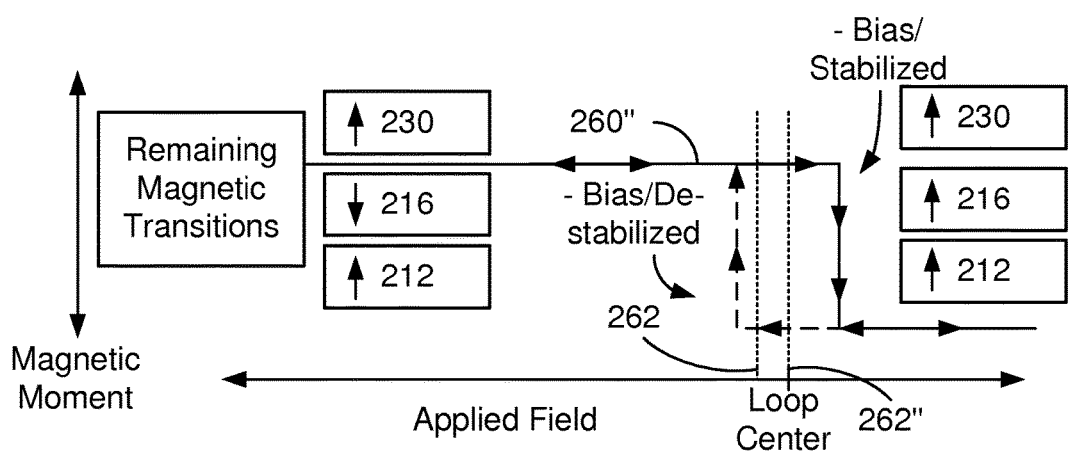

The hysteresis loop for the magnetic layer 216 is obtained at a particular electrical bias while accounting for STT-induced variations, via step 112. Step 112 may be understood with respect to FIGS. 5A-5C. FIGS. 5A, 5B and 5C depict hysteresis loops for the layer 216 at a zero electrical bias, a positive electrical bias (+V) and a negative electrical bias (−V), respectively. FIGS. 5A-5C are not to scale and for explanatory purposes only. Thus, particular behavior, such as being magnetically soft, might not be inferred from the shape and/or location of the hysteresis loops shown. As can be seen in FIGS. 5A-5C in the region of applied field shown, only the magnetic moment of the layer 216 undergoes a transition. Thus, some of the transitions of the remaining layers 230 and (optionally) 250 may occur at a different field indicated by the box labeled "Remaining Magnetic Transitions".

FIG. 5A depicts a curve 260 of the magnetic moment versus applied field for the layer 216 at zero electrical bias. Also shown are the layers 212, 216 and 230 at the corresponding fields. The direction of the magnetic field (increasing in the positive/up direction or increasing in the negative/down direction/decreasing in the up direction)) is shown by arrows on the curve 260. The magnetic field is increased in the up direction through the loop center 262 until the magnetic moment of the layer 216 reverses to align with the magnetic field. This is a coercivity of the layer 216. The field may be increased until the magnetic junction 200 is saturated. The magnetic field is then decreased in the up direction (increased in the down/opposite direction). The field drops below the loop center. When the field is sufficiently decreased, the magnetic moment of the layer 216 reverses to be antiparallel to the field. This is because the antiferromagnetic coupling between the layers 212 and 216 is now sufficiently strong to reverse the magnetic moment of the layer 216. The midpoint between the two reversals is the loop center 262 for a zero/negligible electrical bias.

FIG. 5B depicts a hysteresis loop 260' for a positive electrical bias. The positive electrical bias provides a current having a spin transfer torque that tends to orient the moment of the layer 216 in the up direction. Thus, as the applied magnetic field is increased, a smaller applied field is required to overcome the antiferromagnetic coupling with the layer 212 and reverse the moment of the layer 216. Stated differently, the transition to the up orientation is destabilized. This coercivity occurs at a smaller field. When the field is decreased/increased in the opposite (down) direction, the same spin transfer torque tends to keep the moment of the layer 216 oriented in the up direction. As a result, a lower (more negative/more "down") field is required to for the antiferromagnetic coupling between the layers 212 and 216 to overcome the applied field. Thus, the transition to the down orientation is stabilized. Consequently, the center of the loop 262' is shifted down.

FIG. 5C depicts a hysteresis loop 260" for a negative electrical bias. As used herein, a negative electrical bias simply tends to drive current in the opposite direction through the magnetic junction 200 than a positive electrical bias. The negative electrical bias provides a current with an attendant spin transfer torque that tends to orient the moment of the layer 216 in the down direction. Thus, the transition to the up state is stabilized, while the transition to the down state is destabilized. The center of the loop 262" is shifted to a higher applied field. Because the loop center 262, 262' and 262" shifts with the electrical bias, some mechanism may be used in step 112 to account for this shift when obtaining the hysteresis loop. Step 112 may include measuring an entire hysteresis loop at a positive electrical bias, measuring the entire loop at a negative electrical bias, then determining the STT-induced variations in the coercivities.

The true center for the hysteresis loop is determined, via step 114. If STT-induced shift is accounted for in the manner in which the hysteresis loops are obtained in step 112, then step 114 simply determines the center of the loop. Otherwise, step 114 may include accounting for the shift of the loops depicted in FIGS. 5A-5C to obtain the true center (non-STT-induced shifted) of the hysteresis loop. Steps 112 and 114 are then repeated for various electrical biases. Thus, using the method 110, the shift field for the magnetic layer 216 may be determined. This may determine the magnetic anisotropy field for the magnetic layer 216. The method 110 may be combined with the remainder of the method 100 to map the temperature variation in the magnetic anisotropy for the layer 216 to the electrical bias variation determined in the method 110 and provide the temperature versus electrical bias for the magnetic junction 200. Thus, the benefits of the method 100 may be realized.

Figure 6:
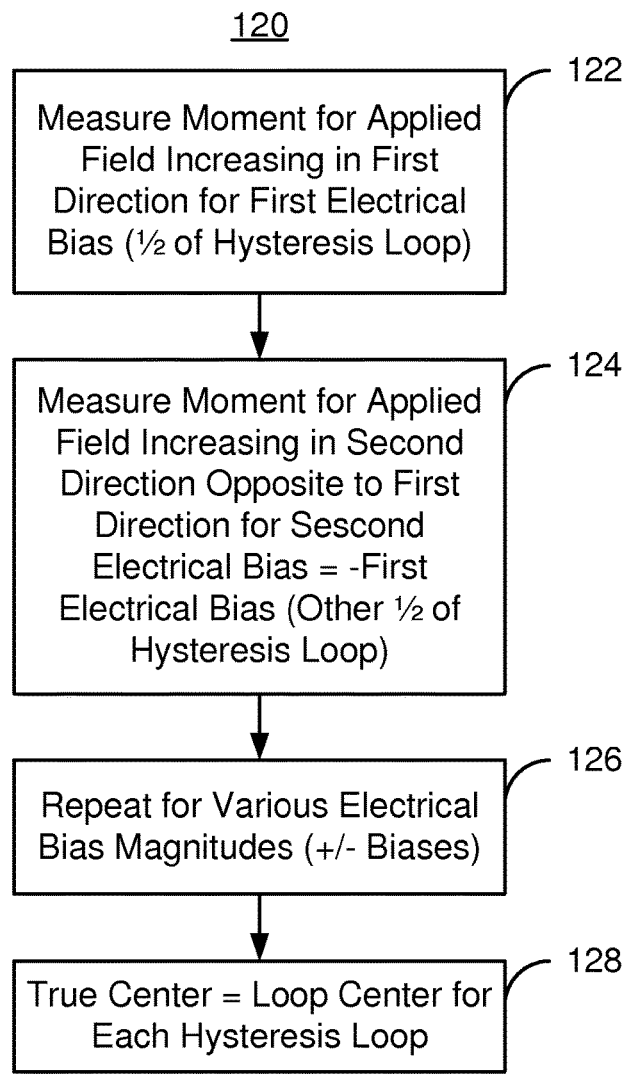
FIG. 6 depicts another exemplary embodiment of a method for determining a temperature of a magnetic junction usable in a magnetic memory programmable using spin transfer torque.

FIG. 6 depicts another exemplary embodiment of a method 120 for determining a temperature of a magnetic junction usable in a magnetic memory programmable using spin transfer torque. More specifically, the method 120 may be used for step 104 of the method 100. The method 120 may be used in connection with the magnetic junction 200. In other embodiments, the method 120 may be used with another magnetic junction having different and/or additional layers. For simplicity, some steps may be omitted or combined. The method 120 may be incorporated into use of magnetic memories. The method 120 also accounts for STT-induced variations, such as the destabilization/stabilization of the coercivity depicted in FIGS. 5A-5C. The method is described in the context of utilizing the magnetic layer 216 of the reference layer 210.

The magnetic moment of the magnetic layer 216 is measured for a first plurality of values of an applied magnetic field while the positive electrical bias is applied to the magnetic junction 200, via step 122. The magnetic field may increase in a first direction from a first magnetic field corresponding to a saturation of the magnetic layer 216 in a second direction opposite to the first direction, through a first coercivity of the magnetic layer 216 and at least to the saturation of the magnetic layer in the first direction. For example, the magnetic field may be increased in the up direction in FIG. 4 until the magnetic layer 216 saturates in the up direction. Alternatively, the magnetic field may be increased in the down direction in FIG. 4 until the magnetic layer 216 saturates in the down direction. Thus, approximately half of the hysteresis loop may be measured in step 122.

The magnetic moment of the magnetic layer 216 is measured for a second plurality of values of an applied magnetic field while a negative electrical bias is applied to the magnetic junction 200, via step 124. The negative electrical bias has the same magnitude as the bias used in step 122, but drives current in the opposite direction. The magnetic field may increase in a second direction from a second magnetic field corresponding to a saturation of the magnetic layer 216 in the first direction opposite, through a second coercivity of the magnetic layer 216 and at least to the saturation of the magnetic layer in the second direction. For example, if the magnetic field was increased in the up direction in step 122, then the magnetic field may be increased in the down direction in FIG. 4 until the magnetic layer 216 saturates in the down direction. Alternatively, the magnetic field may be increased in the up direction in FIG. 4 until the magnetic layer 216 saturates in the up direction if the magnetic field was increased in the down direction in step 122. Thus, approximately half of the hysteresis loop may be measured in step 124. Using steps 122 and 124, the hysteresis loop measured may be measured at the electrical bias. Further, as discussed below, reversing the electrical bias for half of the loop accounts for STT-induced variations in determination of the loop center.

Steps 122 and 124 are repeated for various electrical biases, via step 126. Step 126 repeats the hysteresis loop measurements at the same temperature as steps 122 and 124. Thus, hysteresis loops that have STT-induced variations accounted for are obtained for various electrical biases.

The true center of each hysteresis loop is determined, via step 128. Because STT-induced variations were accounted for in measurement of the hysteresis loops in steps 122, 124 and 126, step 128 merely includes determining the actual center of each hysteresis loop.

As discussed above, the method 120 may be used for step 104 of the method 100. In the method 100, the loop center/magnetic anisotropy versus temperature of the magnetic layer of interest may be obtained in step 102. From the center of this hysteresis loop/magnetic anisotropy versus electrical bias determined using the method 120 and step 102, the temperature versus applied electrical bias for the magnetic junction 200 can be determined.

Figure 7A:
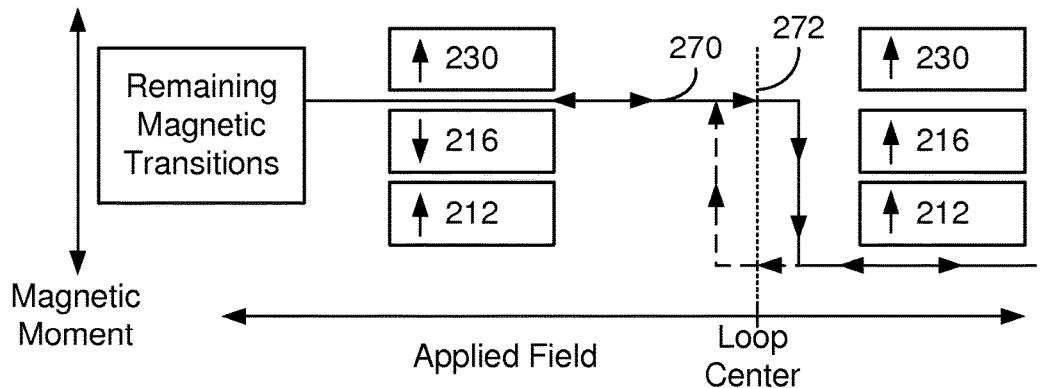
FIGS. 7A-7C depict an exemplary embodiment of hysteresis loops for a magnetic junction usable in a magnetic memory programmable using spin transfer torque under various biases.
Figure 7B:
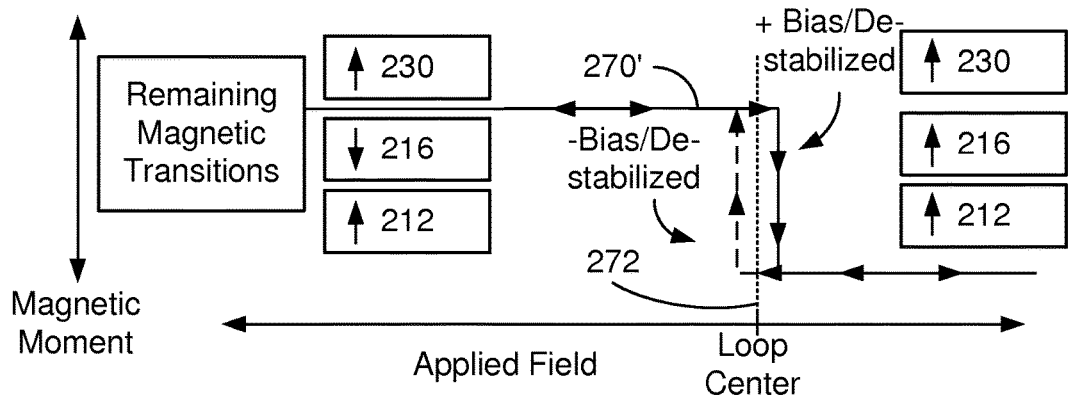
Figure 7C:
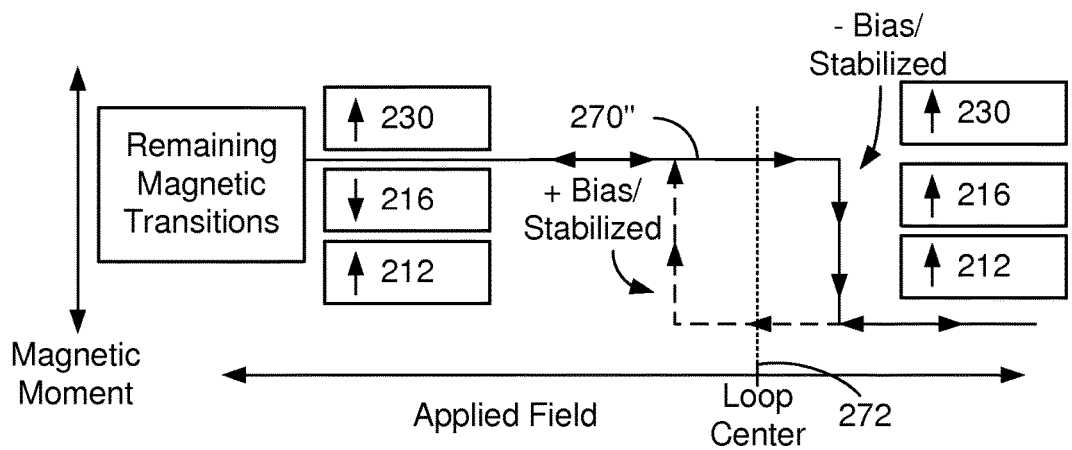

For example, FIGS. 7A, 7B and 7C depict an exemplary embodiment of hysteresis loops 270, 270' and 270", respectively, for the magnetic junction 200. FIGS. 7A-7C are not to scale and for explanatory purposes only. Thus, particular behavior, such as being magnetically soft, might not be inferred from the shape and/or location of the hysteresis loops shown. For the embodiments shown in FIGS. 7A-7C, the magnetic moments of the layers 212 and 216 are antiferromagnetically coupled. Thus, the reference layer 210 is a SAF. FIG. 7A depicts a curve 270 of the magnetic moment versus applied field for the layer 216 at zero electrical bias. Also shown are the layers 212, 216 and 230 at the corresponding fields. The direction of the magnetic field (increasing in the positive/up direction or increasing in the negative/down direction/decreasing in the up direction)) is shown by arrows on the curve 270. The magnetic field is increased in the up direction through the loop center 272 until the magnetic moment of the layer 216 reverses to align with the magnetic field. This is shown by the state of the layers 212, 216 and 230 on the right hand side of the hysteresis loop 270. The magnetic moments of the layers 212, 216 and 230 are aligned. The field may be increased until the magnetic junction 200 is saturated. The magnetic field is then decreased in the up direction (increased in the down/opposite direction). The field drops below the loop center 272. When the field is sufficiently decreased, the magnetic moment of the layer 216 reverses to be antiparallel to the field. This is because the antiferromagnetic coupling between the layers 212 and 216 is now sufficiently strong to reverse the magnetic moment of the layer 216. The midpoint between the two reversals is the loop center 272 for a zero/negligible electrical bias.

FIG. 7B depicts a hysteresis loop 270' obtained using the method 120. In the embodiment shown, the electrical bias changes sign such that the STT-induced variations always tend to destabilize (switch) the magnetic moment of the layer 216. For the purposes of explanation, it is presumed that a positive bias is applied for an applied field that increases in the up direction. The positive electrical bias provides a current through the magnetic junction 200 having a spin transfer torque that tends to orient the moment of the layer 216 in the up direction. Thus, as the applied magnetic field is increased, a smaller applied field is required to overcome the antiferromagnetic coupling with the layer 212 and reverse the moment of the layer 216. Stated differently, the transition to the up orientation is destabilized. This coercivity occurs at a smaller field. When the field is decreased/increased in the opposite (down) direction, the sign of the electrical bias is reversed. However, the magnitude of the electrical bias may be the same. Thus, when the magnetic field increases in the down direction (decreases in the up direction), the current is driven through the magnetic junction 200 in the opposite direction. A resulting spin transfer torque in the opposite direction tends to orient the moment of the layer 216 in the down direction. A higher (less negative/less "down") field is, therefore, required to for the antiferromagnetic coupling between the layers 212 and 216 to overcome the applied field. Thus, the transition to the down orientation is also de-stabilized. Consequently, the center of the loop 272 is not shifted due to spin transfer torque even though the width of the loop 272 (difference between the coercivities) is reduced. Instead, the shift in the loop 270' over that of the loop 270 may be due to the magnitude of the electrical bias (e.g. the magnitude of the current driven through the magnetic junction 200).

FIG. 7C depicts a hysteresis loop 270" obtained using the method 120. In the embodiment shown, the electrical bias changes sign such that the STT-induced variations always tend to destabilize (switch) the magnetic moment of the layer 216. For the purposes of explanation, it is presumed that a negative bias is applied for an applied field that increases in the up direction. As used herein, a negative electrical bias simply tends to drive current in the opposite direction through the magnetic junction 200 than a positive electrical bias. The negative electrical bias provides a current with an attendant spin transfer torque that tends to orient the moment of the layer 216 in the down direction. Thus, the transition to the up state is stabilized. When the applied field is reversed, the electrical bias is also reversed. Thus, when the magnetic field increases in the down direction (decreases in the up direction), the current is driven through the magnetic junction 200 in the opposite direction. The resulting spin transfer torque also tends to stabilize the transition of the magnetic moment of the layer 216 to the down state. The center 272 of the loop 270" is thus not shifted due to spin transfer torque. Instead, the shift in the loop may be due to the magnitude of the electrical bias.

Thus, as can be seen in FIGS. 7A-7C, the method 120 may be used to determine the shift field for hysteresis loops. Thus, the method 120 may be used to determine the magnetic anisotropy for a magnetic layer 216. Consequently, the temperature versus electrical bias may be calibrated for the magnetic junction 200.

Figure 8A:
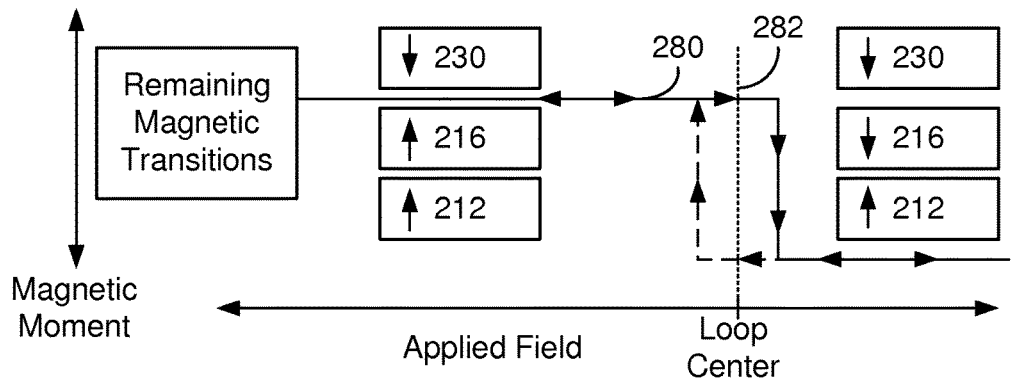
FIGS. 8A-8C depict an exemplary embodiment of hysteresis loops for a magnetic junction usable in a magnetic memory programmable using spin transfer torque under various biases.
Figure 8B:
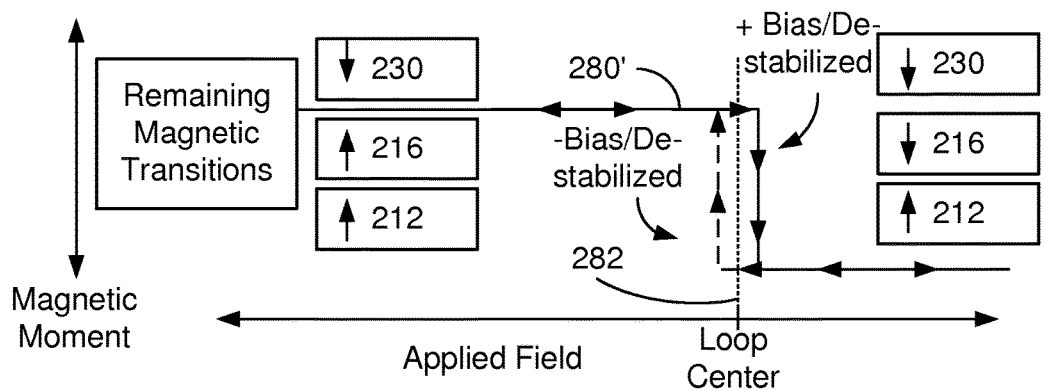
Figure 8C:
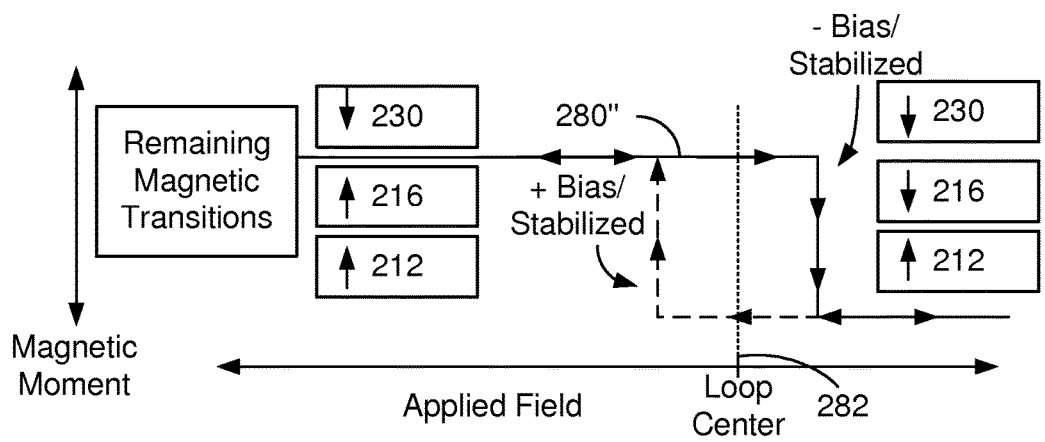

Use of the method 120 may not be limited to the layer 216/210 or to the configuration in which the reference layer 210 is a SAF. For example, FIGS. 8A, 8B and 8C depict an exemplary embodiment of hysteresis loops 280, 280' and 280", respectively, for the magnetic junction 200 in which the magnetic moments of the layers 212 and 216 are ferromagnetically coupled. For example, the reference layer 210 may be a multilayer including two ferromagnetic layers 212 and 216 that are ferromagnetically coupled though a nonmagnetic layer 214, which may be an FeTa layer. FIGS. 8A-8C are not to scale and for explanatory purposes only. Thus, particular behavior, such as being magnetically soft, might not be inferred from the shape and/or location of the hysteresis loops shown.

FIG. 8A depicts a curve 280 of the magnetic moment versus applied field for the layer 216 at zero or very small electrical bias. Also shown are the layers 212, 216 and 230 at the corresponding fields. The hysteresis loop 280 is analogous to the loops 260 and 270. To the extent that there are STT-induced variations in the hysteresis loop 280, these variations may be negligible. The midpoint between the two reversals is the loop center 282 for a zero/negligible electrical bias.

FIG. 8B depicts a hysteresis loop 280' obtained using the method 120. In the embodiment shown, the electrical bias changes sign such that the STT-induced variations always tend to destabilize (switch) the magnetic moment of the layer 216. For the purposes of explanation, it is presumed that a positive bias is applied for an applied field that increases in the up direction. The hysteresis loop 280' is obtained in a manner analogous to the hysteresis loop 270'. Although the width of the loop is smaller because the magnetic state of the layer 216 is destabilized, the loop shift is substantially unaffected by spin transfer torque. Consequently, the position of the center of the loop 282 may be due to the magnitude of the electrical bias (e.g. the magnitude of the current driven through the magnetic junction 200. Thus, the shift field may be obtained substantially independent of STT-induced variations.

FIG. 8C depicts a hysteresis loop 280" obtained using the method 120. In the embodiment shown, the electrical bias changes sign such that the STT-induced variations always tend to destabilize (switch) the magnetic moment of the layer 216. For the purposes of explanation, it is presumed that a negative bias is applied for an applied field that increases in the up direction. As used herein, a negative electrical bias simply tends to drive current in the opposite direction through the magnetic junction 200 than a positive electrical bias. The hysteresis loop 280" is obtained in a manner analogous to the hysteresis loop 270". Although the hysteresis loop 280" is wider because the magnetic state of the layer 216 is stabilized, the loop shift is substantially unaffected by spin transfer torque. Consequently, the position of the center of the loop 282 may be due to the magnitude of the electrical bias (e.g. the magnitude of the current driven through the magnetic junction 200. Thus, the shift field may be obtained substantially independent of STT-induced variations.

Thus, as can be seen in FIGS. 8A-8C, the method 120 may be used to determine the shift field for hysteresis loops for the magnetic layer 216 if the layers 212 and 216 are ferromagnetically coupled. Thus, the method 120 may be used to determine the magnetic anisotropy for a magnetic layer 216. Consequently, the temperature versus electrical bias may be calibrated for the magnetic junction 200.

Although not expressly depicted and described, the anisotropy of the optional PEL 222, the optional reference layer 250, the free layer 230, magnetic layer(s) within the optional reference layer 250 and/or other magnetic layers (not shown) may be investigated in a manner analogous to the layer 216. Thus, the shift in the hysteresis loop may be used to determine the dependence of the magnetic anisotropy in the layer (whatever the source) on the electrical bias and temperature. In such cases, the effects of spin transfer torque, such as the stabilization/destabilization of the magnetic layer, are to be accounted for.

Figure 9:
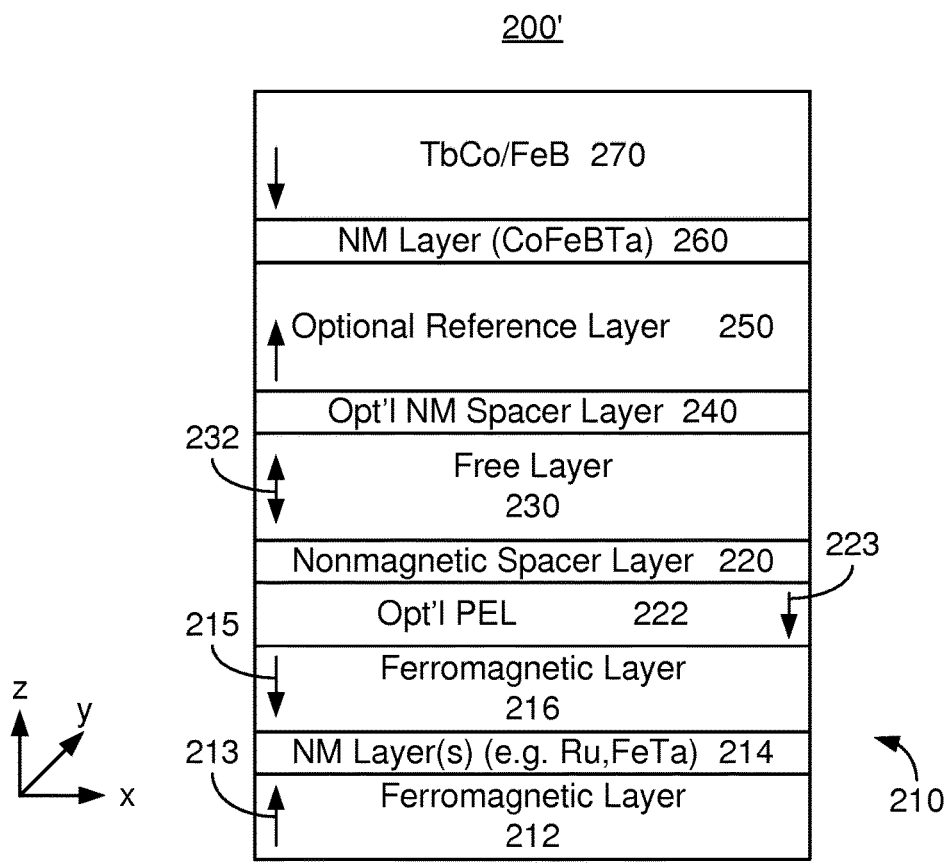
FIG. 9 depicts another exemplary embodiment of a magnetic junction usable in a magnetic memory programmable using spin transfer torque.

FIG. 9 depicts another exemplary embodiment of a magnetic junction 200' with which the method 100, 110, and/or 120 may be used. For clarity, FIG. 9 is not to scale. The magnetic junction 200' may be used in a magnetic device such as a STT-MRAM and, therefore, in a variety of electronic devices. The magnetic junction 200' is analogous to the magnetic junction 200. Thus, similar components have analogous labels. The magnetic junction thus includes a reference layer 210, a nonmagnetic spacer layer 220, a free layer 230 and optional additional nonmagnetic spacer layer 240 and an optional additional reference layer 250, which might be omitted. The layer 240 may be a capping layer if the reference layer 250 is omitted. The magnetic junction 200 may also include optional seed layer(s), optional pinning layer(s), optional capping layer(s) and bottom and top contacts, which are not shown for simplicity. Devices (not shown) including but not limited to a transistor may be formed in the substrate below the magnetic junction 200. Although layers 210, 220, 230, 240 and 250 are shown with a particular orientation, this orientation may vary in other embodiments. The optional pinning layer(s) (not shown) may be used to fix the magnetization of the reference layer(s) 210 and 250, respectively. However, in other embodiments, the optional pinning layers may be omitted or another structure may be used. In some embodiments, the perpendicular magnetic anisotropy energies of the reference layer 210, the free layer 230 and the optional reference layer 250 exceed the out of plane demagnetization energy, the magnetic moments of the layers 210, 230 and 250 may be out of plane (e.g. perpendicular-to-plane). This situation is shown in FIG. 9. In such embodiments, the pinning layer may be omitted. In the embodiment shown, the reference layer 210 is a SAF including ferromagnetic layers 212 and 216 that are separated by a nonmagnetic layer 214. In the embodiment shown, the layers 212 and 216 have magnetic moments 213 and 215, respectively, that are coupled via an RKKY interaction, for example through a Ru layer 214. In other embodiments, the magnetic moments 213 and 215 may be ferromagnetically coupled, for example through an FeTa layer 214. In other embodiments, the reference layer 210 may be a single layer or may be another multilayer including additional or different layers. Similarly, the free layer 230 and/or reference layer 250 may be analogous multilayers. The magnetic junction 200 is also configured to allow the magnetic moment 232 of the free layer 230 to be switched between stable magnetic states when a write current is passed through the magnetic junction 200. Thus, the free layer 230 is switchable utilizing spin transfer torque. Also shown is optional polarization enhancement layer 222 having moment 223, which is magnetically coupled with the layer 210/216. In other embodiments, the PEL 222 may be omitted and/or other PEL(s) (not shown) may be included in other analogous locations.

The magnetic junction 200' also include a nonmagnetic layer 260 and an additional ferromagnetic layer 270. The nonmagnetic layer 260 is indicated as including CoFeBTa, but other materials might be used in other embodiments. The ferromagnetic layer 270 is indicated as being a TbCo/FeB layer 270. Note that in embodiments in which the reference layer 250 is omitted, the layer 270 might function as a reference layer, particularly if a PEL (not shown) is inserted between the layer 270 and the layer 240 and the layer 260 is omitted.

The magnetic layer 2270 may have a saturation magnetization that depends strongly on temperature. Thus, other layers, including but not limited to a Co/Pd multilayer, having a saturation magnetization that strongly depends upon temperature may be used in place of the TbCo/FeB layer 270. Because the saturation magnetization is highly dependent upon temperature, the TbCo/FeB layer 270 exerts a stray field on the remaining layers of the magnetic junction 200' that depend strongly on temperature. As a result, such a stray field may be useful in determining the temperature of the magnetic junction 200'. More specifically, the shift in the hysteresis loop due to the stray field from the TbCo/FeB layer 270 for one or more of the layers 210, 212, 216, 222, 230 and/or 250 may be investigated to calibrate the temperature versus electrical bias. One or more of the magnetic layers 210, 212, 216, 222, 230, 250 and/or their sublayers (if a multilayer) may be used in carrying out the method 100, 110 and/or 120. For simplicity, investigation of the free layer 230 is described.

Figure 10A:
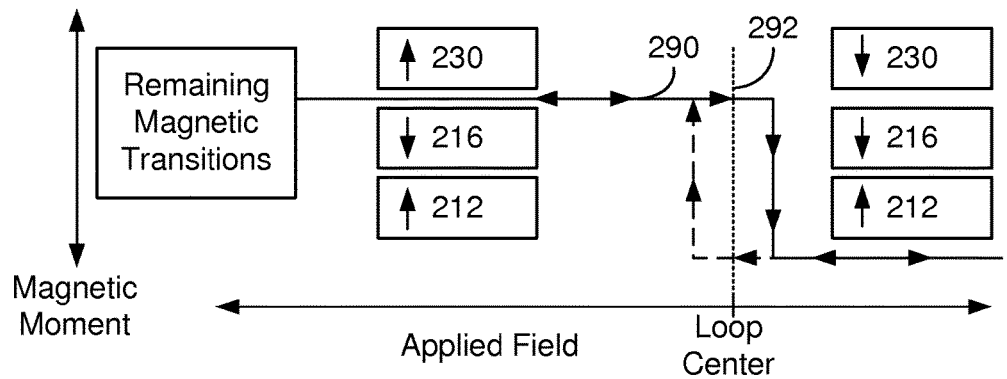
FIGS. 10A-10C depict an exemplary embodiment of hysteresis loops for a magnetic junction usable in a magnetic memory programmable using spin transfer torque.
Figure 10B:
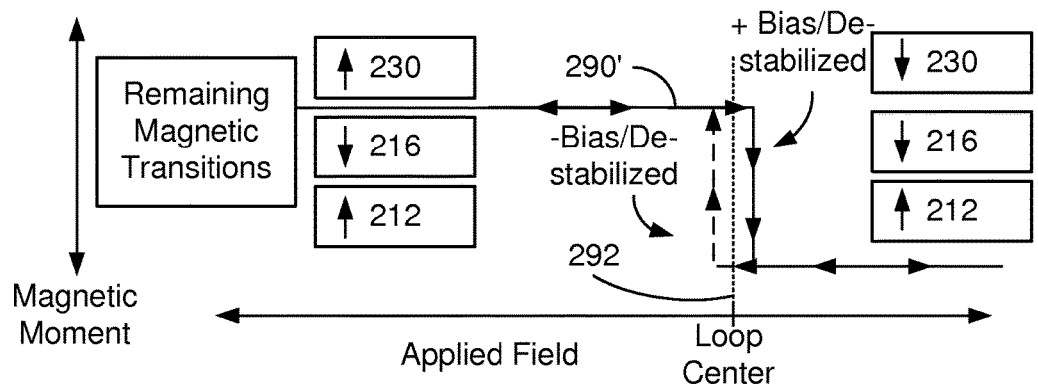
Figure 10C:
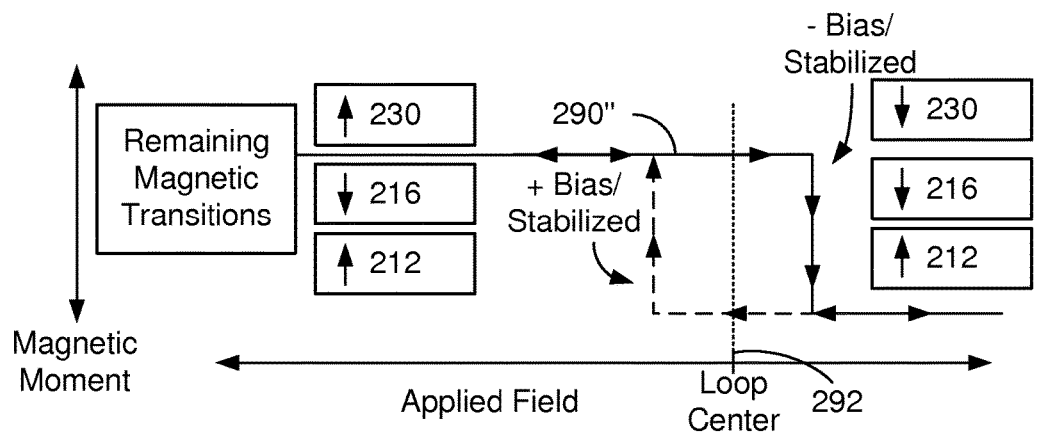

FIGS. 10A, 10B and 10C depict an exemplary embodiment of hysteresis loops 290, 290' and 290", respectively, for the magnetic junction 200'. FIGS. 10A-10C are not to scale and for explanatory purposes only. Thus, particular behavior, such as being magnetically soft, might not be inferred from the shape and/or location of the hysteresis loops shown. FIG. 10A depicts a curve 29 of the magnetic moment versus applied field for the free layer 230 at zero or very small electrical bias. Also shown are the layers 212, 216 and 230 at the corresponding fields. The hysteresis loop 290 is analogous to the loops 260, 270 and 280. To the extent that there are STT-induced variations in the hysteresis loop 290, these variations may be negligible. The midpoint between the two reversals is the loop center 292 for a zero/negligible electrical bias.

FIG. 10B depicts a hysteresis loop 290' obtained using the method 120 (and/or 100 and 110). In the embodiment shown, the electrical bias changes sign such that the STT-induced variations always tend to destabilize (switch) the magnetic moment of the free layer 230. For the purposes of explanation, it is presumed that a positive bias is applied for an applied field that increases in the up direction. The hysteresis loop 290' is obtained in a manner analogous to the hysteresis loop 270' and 280'. Although the width of the loop is smaller because the magnetic state of the free layer 230 is destabilized, the loop shift is substantially unaffected by spin transfer torque. Consequently, the position of the center of the loop 292 may be due to the magnitude of the electrical bias (e.g. the magnitude of the current driven through the magnetic junction 200'. Thus, the shift field may be obtained substantially independent of STT-induced variations.

FIG. 10C depicts a hysteresis loop 290" obtained using the method 120. In the embodiment shown, the electrical bias changes sign such that the STT-induced variations always tend to destabilize (switch) the magnetic moment of the free layer 230. For the purposes of explanation, it is presumed that a negative bias is applied for an applied field that increases in the up direction. As used herein, a negative electrical bias simply tends to drive current in the opposite direction through the magnetic junction 200' than a positive electrical bias. The hysteresis loop 290" is obtained in a manner analogous to the hysteresis loop 270" and/or 280". Although the hysteresis loop 290" is wider because the magnetic state of the free layer 230 is stabilized, the loop shift is substantially unaffected by spin transfer torque. Consequently, the position of the center of the loop 92 may be due to the magnitude of the electrical bias (e.g. the magnitude of the current driven through the magnetic junction 200. Thus, the shift field may be obtained substantially independent of STT-induced variations.

As can be seen in FIGS. 10A-10C, the method 120 may be used to determine the shift field for hysteresis loops for the free layer 230 for a magnetic anisotropy/shift field due to stray fields from a layer 270 having a temperature varying saturation magnetization. Consequently, the temperature versus electrical bias may be calibrated for the magnetic junction 200'.

Thus, using the methods 110 and/or 120 a magnetic anisotropy for one or more of the magnetic layers of a magnetic junction, such as the magnetic junction 200 and/or 200' may be used to determine the temperature of the magnetic junction. More specifically, STT-induced affects may be accounted for and the temperature versus electrical bias may be determined. Thus, performance, endurance and/or reliability of the magnetic junction may be improved.

Figure 11:
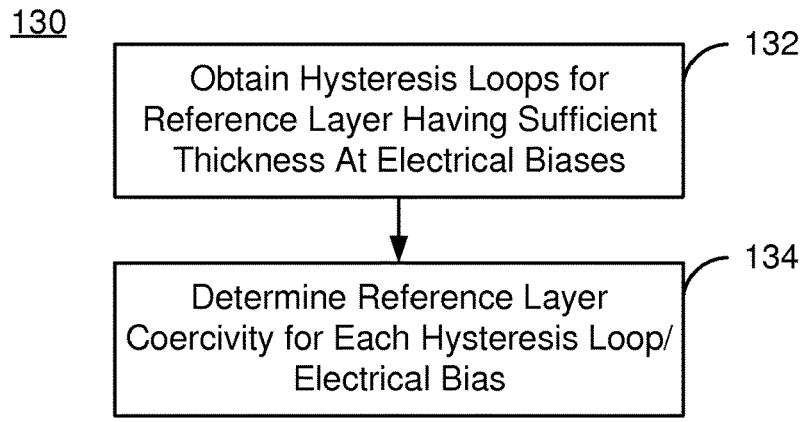
FIG. 11 depicts another exemplary embodiment of a method for determining a temperature of a magnetic junction usable in a magnetic memory programmable using spin transfer torque.

Other mechanisms exist for determining the temperature of the magnetic junction based on magnetic behavior while accounting for spin transfer effects. FIG. 11 depicts an exemplary embodiment of a method 130 for determining a temperature of a magnetic junction usable in a magnetic memory programmable using spin transfer torque. More specifically, the method 130 may be used for step 104 of the method 100. The method 130 may be used in connection with the magnetic junction 200. In other embodiments, the method 130 may be used with another magnetic junction having different and/or additional layers. For simplicity, some steps may be omitted or combined. The method 130 may be incorporated into use of magnetic memories. The method 130 also accounts for STT-induced variations. The method 130 is described in the context of utilizing the reference layer 250. The method 130, however, is generally not desired to be used with the free layer 230 because the free layer 230 is switchable using spin transfer torque.

The method 130 is used for magnetic layer(s), such as the reference layer 250 which has a strong dependence on temperature. For example, the method 130 may have particular utility for a magnetic junction having a TbCo/FeB bilayer and/or a Co/Pd multilayer for the reference layer 250. For the method 130, the reference layer 250 also has a coercivity that is substantially independent of STT-induced variations. For example, the thickness of the reference layer 250 may be sufficient that a stabilization/destabilization of the coercivity due to spin transfer may be negligible for the desired measurement quality. In some embodiments, the STT-induced variation in the coercivity may be less than five percent. In some such embodiments, the STT-induced variation in the coercivity may be less than one percent.

Hysteresis loops for the reference layer 250 are obtained at multiple electrical biases, via step 132. In some embodiments, only a single electrical bias is used for each hysteresis loop. The electrical bias need not be reversed part way through the hysteresis loop because the geometry of the reference layer 250 allows the STT-induced effects on the coercivity to be ignorable. In some embodiments, however, positive and negative electrical biases may be used for thoroughness. In some embodiments, a full hysteresis loop is taken at a positive electrical bias, then a full hysteresis loop is taken at a negative electrical bias (or vice versa). Alternatively, the bias may still be reversed partway through the loop as in the method 120. Step 132 is carried out at substantially constant temperature.

The coercivity of the reference layer 250 for each hysteresis loop is determined, via step 134. Thus, the coercivity for each electrical bias is also determined in step 134. Thus, the coercivity versus electrical bias may be obtained while accounting for spin transfer effects.

In the method 100, the coercivity versus temperature of the layer 250 may be obtained in step 102. The coercivity versus electrical bias may then be determined using the method 130 for step 104. The coercivity versus temperature may be mapped to the coercivity versus electrical bias to obtain the temperature versus electrical bias for the magnetic junction 200/200'. Thus, the method 130 may be used to calibrate the temperature versus electrical bias of a magnetic junction.

Figure 12:
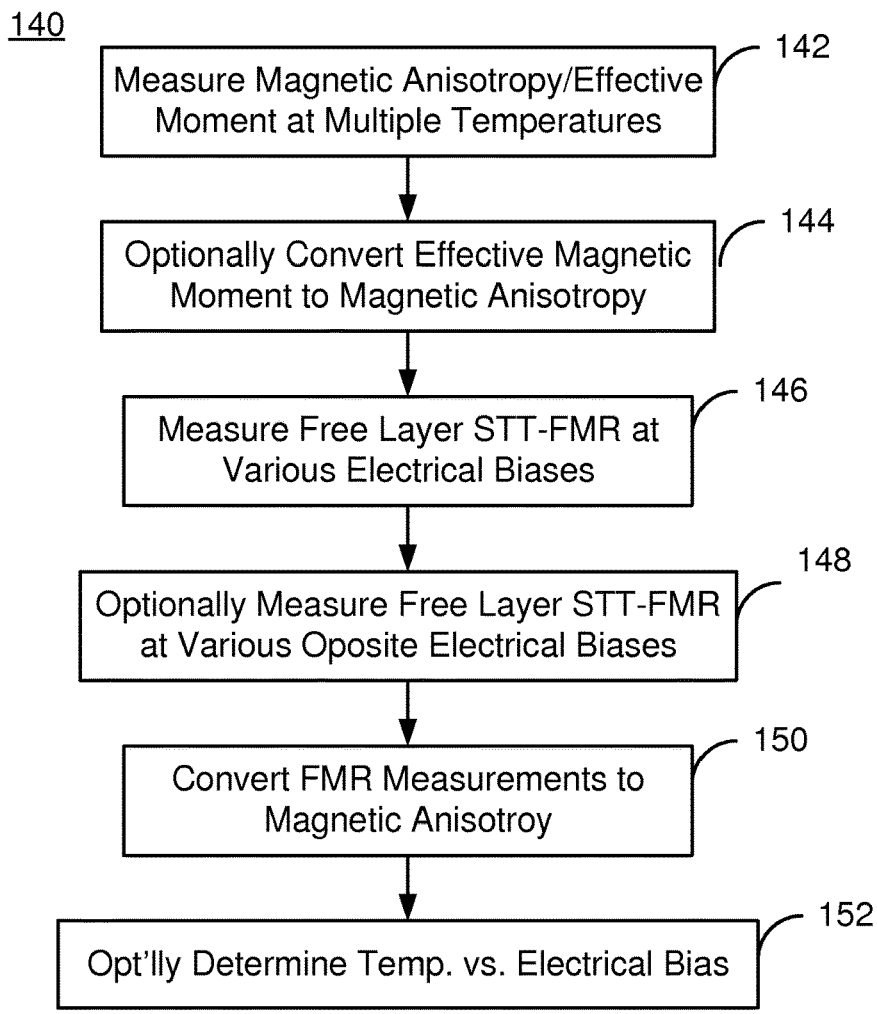
FIG. 12 depicts another exemplary embodiment of a method for determining a temperature of a magnetic junction usable in a magnetic memory programmable using spin transfer torque.

FIG. 12 depicts an exemplary embodiment of a method 140 for determining a temperature of a magnetic junction usable in a magnetic memory programmable using spin transfer torque. The method 140 is analogous to the method 100. The method 140 may be used in connection with the magnetic junction 200. In other embodiments, the method 140 may be used with another magnetic junction having different and/or additional layers. For simplicity, some steps may be omitted or combined. The method 140 may be incorporated into use of magnetic memories. The method 140 also accounts for STT-induced variations. The method 140 is described in the context of utilizing the free layer 230 of the magnetic junction 200. However, the method 140 may be used with other magnetic junctions including but not limited to the magnetic junction 200'. The method 140 may find particular utility where the relevant magnetic properties, such as magnetic anisotropy and/or coercivity, of the reference layer 210 and/or 250 do not vary sufficiently with temperature.

The temperature variation of the saturation magnetization of the free layer 230 is determined, via step 142. Thus, the effective magnetic moment of the free layer 230 is determined at multiple temperatures. The effective magnetic moment may be considered the saturation magnetization plus the magnetic anisotropy for the free layer. Stated differently, the effective magnetic moment is the magnetic anisotropy of the free layer minus the contribution of the shape anisotropy (the combination of the saturation magnetization and shape). Step 142 may include measuring the effective magnetic moment at multiple temperatures throughout the temperature range of interest. The measurements taken in step 142 are at a constant electrical bias for the magnetic junction. In some embodiments, the electrical bias is zero or very small. Thus, only a very small (or zero) current may be driven through the magnetic junction in a CPP direction. At such small currents, spin transfer torque may be negligible for the measurements taken in step 142.

The saturation magnetization is converted to a magnetic anisotropy (e.g. a crystalline or interfacial magnetic anisotropy) for the free layer 230, via step 144. In other embodiments, another mechanism might be used in place of steps 142 and 144 to measure the temperature dependence of the magnetic anisotropy of the free layer 230.

The ferromagnetic resonance (FMR) of the free layer is determined at various electrical biases, via step 146. In some embodiments, the spin transfer FMR (STT-FMR) is used in step 146. STT-FMR utilizes a current driven through the magnetic junction in order to excite the FMR. STT-FMR allows particular magnetic junctions in a magnetic memory to be excited and, therefore, investigated. In addition, STT-FMR utilizes the varying electrical bias applied to obtain the signal of interest. In STT-FMR, the resonance peak occurs at a particular frequency. The magnitude of the frequency is indicative of the magnetic anisotropy of the free layer. Thus, STT-FMR allows for a determination of the magnetic anisotropy versus electrical bias. Further, STT-induced variations in the magnetic junction generally cause a broadening of the FMR peak, rather than a shift in the FMR frequency. As such, STT-induced variations may not change the determination of the magnetic anisotropy using FMR. Stated differently, the electrical biases of opposite polarities need not be applied in order to account for STT-induced variations in STT-FMR.

In some embodiment, the STT-FMR is measured for another set of electrical biases, via step 148. The electrical biases used in step 148 have opposite polarity to those used in step 146. Step 148 may be carried out to further investigate the properties of the free layer 230. However, in other embodiments, step 148 may be omitted.

The FMR measurements of step 146 and/or 148 are converted to magnetic anisotropies, via step 150. Thus, the temperature variation of the magnetic anisotropy is determined in steps 142 and 144. The electrical bias variation of the magnetic anisotropy is determined in steps 146, optional step 148 and step 150. Thus, the temperature versus electrical bias may optionally be determined in step 152.

Using the method 140 the temperature versus electrical bias may be determined while accounting for spin transfer effects. Thus, the performance, endurance and/or reliability of the magnetic junction 200 may be improved.

A method and system for determining temperature versus electrical bias of a magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A method for measuring a temperature of magnetic junction switchable using spin transfer, the magnetic junction including at least one magnetic layer, the method comprising:
   measuring a temperature variation of at least one magnetic characteristic for the at least one magnetic layer versus temperature;
   measuring a bias variation in the at least one magnetic characteristic versus an electrical bias for the magnetic junction such that at least one spin transfer torque-induced variation in the at least one magnetic characteristic is accounted for, the step of measuring the bias variation further including
      performing a plurality of measurements of the at least one magnetic characteristic at a plurality of electrical biases, each of the plurality of measurements being performed at a positive electrical bias having a magnitude and a negative electrical bias having the magnitude; and
   determining the temperature versus the electrical bias for the magnetic junction based on the temperature variation and the bias variation.

2. The method of claim 1 wherein the magnetic junction includes at least one reference layer, at least one nonmagnetic spacer layer and at least one free layer, the at least one nonmagnetic spacer layer being between the at least one free layer and the at least one reference layer, the at least one free layer being switchable between a plurality of stable magnetic states when a write current is passed through the magnetic junction, the magnetic characteristic being a magnetic anisotropy of the at least one magnetic layer, wherein the step of measuring the bias variation further includes:
   obtaining a hysteresis loop for the at least one magnetic layer at the each of the plurality of electrical biases; and
   determining a true center for the hysteresis loop of the at least one magnetic layer at the each of the plurality of electrical biases.

3. The method of claim 2 wherein the step of obtaining the hysteresis loop includes:
   measuring a magnetic moment of the at least one magnetic layer for a first plurality of values of an applied magnetic field while the positive electrical bias is applied to the magnetic junction, the applied magnetic field increasing in a first direction from a first magnetic field corresponding to a saturation of the at least one magnetic layer in a second direction opposite to the first direction through a first coercivity of the magnetic layer and at least to the saturation of the magnetic layer in the first direction;
   measuring the magnetic moment of the magnetic layer for a second plurality of values of the applied magnetic field while the negative electrical bias is applied to the magnetic junction, the applied magnetic field increasing in the second direction from a second magnetic field corresponding to the saturation of the at least one magnetic layer in the first direction through a second coercivity of the magnetic layer and at least to the saturation of the magnetic layer in the second direction, the steps of measuring the magnetic moment of the magnetic layer for the first and second plurality of values providing the hysteresis loop for the electrical bias having the magnitude; and
   repeating the steps of measuring in the first direction and measuring in the second direction for a remainder of the plurality of electrical biases.

4. The method of claim 2 wherein the at least one magnetic layer has a location, the location being selected from a first location in the reference layer such that the at least one magnetic layer is part of a reference layer including a plurality of magnetic layers and separated by at least one nonmagnetic layer, a second location between the reference layer and the free layer such that the at least one magnetic layer is a polarization enhancement layer, a third location in the free layer such that the free layer includes the at least one magnetic layer and a fourth location separate from the free layer and the reference layer.

5. The method of claim 1 wherein the magnetic junction includes at least one reference layer, at least one nonmagnetic spacer layer and at least one free layer, the at least one nonmagnetic spacer layer being between the at least one free layer and the at least one reference layer, the free layer being switchable between a plurality of stable magnetic states when a write current is passed through the magnetic junction, wherein the at least one magnetic characteristic includes a magnetic anisotropy, wherein the at least one free layer includes the at least one magnetic layer, and wherein the plurality of measurements are a plurality of spin transfer ferromagnetic resonance (ST-FMR) measurements.

6. The method of claim 5 wherein the step of measuring the temperature variation further includes:
measuring an effective magnetic moment for the at least one free layer at a plurality of temperatures.

7. The method of claim 6 wherein the step of measuring the temperature variation further includes:
converting the effective magnetic moment to a magnetic anisotropy.

8. A method for measuring a temperature of magnetic junction switchable using spin transfer, the magnetic junction including at least one magnetic layer, the magnetic junction including at least one reference layer, at least one nonmagnetic spacer layer and at least one free layer, the at least one nonmagnetic spacer layer being between the at least one free layer and the at least one reference layer, the free layer being switchable between a plurality of stable magnetic states when a write current is passed through the magnetic junction, the method comprising:
measuring a temperature variation of at least one magnetic characteristic for the at least one magnetic layer versus temperature, wherein the at least one magnetic characteristic includes a magnetic anisotropy, wherein the at least one free layer includes the at least one magnetic layer;
measuring a bias variation in the at least one magnetic characteristic versus an electrical bias for the magnetic junction such that at least one spin transfer torque-induced variation in the at least one magnetic characteristic is accounted for, the step of measuring the bias variation including a plurality of measurements; and
determining the temperature versus the electrical bias for the magnetic junction based on the temperature variation and the bias variation, and wherein the plurality of measurements are a plurality of spin transfer ferromagnetic resonance (ST-FMR) measurements.

9. A method for measuring a temperature of magnetic junction switchable using spin transfer, the magnetic junction including at least one magnetic layer, wherein the magnetic junction includes at least one reference layer, at least one nonmagnetic spacer layer and at least one free layer, the at least one nonmagnetic spacer layer being between the at least one free layer and the at least one reference layer, the free layer being switchable between a plurality of stable magnetic states when a write current is passed through the magnetic junction, the at least one magnetic layer being a reference layer of the at least one reference layer, the at least one magnetic characteristic being a reference layer coercivity, the reference layer having a thickness such that the at least one spin transfer torque-induced variation is not more than one percent of the coercivity, the method comprising:
measuring a temperature variation of at least one magnetic characteristic for the at least one magnetic layer versus temperature;
measuring a bias variation in the at least one magnetic characteristic versus an electrical bias for the magnetic junction such that at least one spin transfer torque-induced variation in the at least one magnetic characteristic is accounted for, and wherein the step of measuring the bias variation further includes:
obtaining a hysteresis loop for the reference layer at the each of the plurality of electrical biases; and
determining a true center for the hysteresis loop of the reference layer at the each of the plurality of electrical biases; and
determining the temperature versus the electrical bias for the magnetic junction based on the temperature variation and the bias variation.

* * * * *